US008927369B2

(12) United States Patent
Chan et al.

(10) Patent No.: US 8,927,369 B2
(45) Date of Patent: Jan. 6, 2015

(54) METHOD OF FORMING A TRENCH GATE MOSFET HAVING A THICK BOTTOM OXIDE

(71) Applicant: UBIQ Semiconductor Corp., Hsinchu County (TW)

(72) Inventors: Chien-Ling Chan, Hsinchu County (TW); Chi-Hsiang Lee, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 91 days.

(21) Appl. No.: 13/789,692

(22) Filed: Mar. 8, 2013

(65) Prior Publication Data

US 2014/0017864 A1 Jan. 16, 2014

(30) Foreign Application Priority Data

Jul. 13, 2012 (TW) .............................. 101125348 U

(51) Int. Cl.
*H01L 21/336* (2006.01)
*H01L 29/66* (2006.01)
*H01L 29/423* (2006.01)
*H01L 29/78* (2006.01)
*H01L 29/417* (2006.01)

(52) U.S. Cl.
CPC .... *H01L 29/66666* (2013.01); *H01L 29/42368* (2013.01); *H01L 29/66727* (2013.01); *H01L 29/66734* (2013.01); *H01L 29/7813* (2013.01); *H01L 29/41766* (2013.01); *H01L 29/42376* (2013.01)
USPC .......................................... 438/272; 438/270

(58) Field of Classification Search
None
See application file for complete search history.

(56) References Cited

U.S. PATENT DOCUMENTS

| 5,998,833 | A | 12/1999 | Baliga |
| 7,385,248 | B2 | 6/2008 | Herrick et al. |
| 7,476,589 | B2 | 1/2009 | Grebs et al. |
| 2005/0090060 | A1* | 4/2005 | Aoki et al. ................... 438/259 |
| 2006/0019448 | A1* | 1/2006 | Darwish et al. .............. 438/270 |
| 2006/0121676 | A1* | 6/2006 | Darwish ...................... 438/272 |
| 2006/0255402 | A1* | 11/2006 | Hshieh et al. ................ 257/330 |
| 2011/0212586 | A1* | 9/2011 | Grebs et al. .................. 438/270 |
| 2011/0233659 | A1* | 9/2011 | Tai ............................... 257/330 |
| 2012/0032258 | A1* | 2/2012 | Zeng et al. ................... 257/330 |
| 2012/0142155 | A1* | 6/2012 | Murphy et al. ............... 438/270 |

* cited by examiner

Primary Examiner — Charles Garber
Assistant Examiner — Brigitte Paterson
(74) Attorney, Agent, or Firm — Jianq Chyun IP Office

(57) ABSTRACT

A method of forming a trench gate MOSFET is provided. An epitaxial layer is formed on a substrate. A trench is formed in the epitaxial layer. A first insulating layer is conformally formed on surfaces of the epitaxial layer and the trench. A first conductive layer is formed at the bottom of the trench. A portion of the first insulating layer is removed to form a second insulating layer exposing an upper portion of the first conductive layer. An oxidation process is performed to oxidize the first conductive layer to a third insulating layer, wherein a fourth insulating layer is simultaneously formed on the surface of the epitaxial layer and on the sidewall of the trench. A second conductive layer is formed in the trench. Two body layers are formed in the epitaxial layer beside the trench. Two doped regions are formed in the body layers respectively beside the trench.

11 Claims, 7 Drawing Sheets

US 8,927,369 B2

METHOD OF FORMING A TRENCH GATE MOSFET HAVING A THICK BOTTOM OXIDE

CROSS-REFERENCE TO RELATED APPLICATION

This application claims the priority benefit of Taiwan application serial no. 101125348, filed on Jul. 13, 2012, the entirety of the above-mentioned patent application is hereby incorporated by reference herein and made a part of this specification.

BACKGROUND

1. Field of the Invention

The invention relates to a method of forming a semiconductor device, and more particularly to a method of forming a trench gate metal-oxide-semiconductor field effect transistor (MOSFET).

2. Description of Related Art

Trench MOSFET has been widely applied in power switch devices, such as power supplies, rectifiers, low-voltage motor controllers, or so forth. In general, the trench MOSFET is often resorted to a design of vertical structure to enhance the device density. In a power MOSFET, each drain region is formed on the back-side of a chip, and each source region and each gate are formed on the front-side of the chip. The drain regions of the transistors are connected in parallel so as to endure a considerable large current.

A working loss of the trench MOSFET may be divided into a switching loss and a conducting loss, wherein the switching loss caused by the input capacitance $C_{iss}$ is going up as the operation frequency is increased. The input capacitance $C_{iss}$ includes a gate-to-source capacitance $C_{gs}$ and a gate-to-drain capacitance $C_{gd}$. When the gate-to-drain capacitance $C_{gd}$ is decreased, the switching loss is accordingly reduced.

A conventional method is to fill in the trench with an insulating layer, and then to remove the insulating layer with an etching back process, so that a thick oxide layer is formed at the bottom of the trench to lower the gate-to-drain capacitance $C_{gd}$. However, the above method is very difficult and requires a precise control in order to avoid a channel offset.

SUMMARY OF THE INVENTION

Accordingly, the invention provides a method capable of forming a trench MOSFET having a thick bottom oxide (TBOX) with a favorable process control.

The invention provides a method of forming a trench gate MOSFET. An epitaxial layer with a first conductivity type is formed on a substrate with the first conductivity type. A trench is formed in the epitaxial layer. A first insulating layer and a first conductive layer are conformally formed on surfaces of the epitaxial layer and the trench. The second insulating layer fills up in the trench. A portion of the first conductive layer is removed to form a second conductive layer below the second insulating layer. The second insulating layer and a portion of the first insulating layer are removed to form a third insulating layer below the second conductive layer. An oxidation process is performed to oxidize the second conductive layer to a fourth insulating layer, and a fifth insulating layer is simultaneously formed on the surface of the epitaxial layer and on a sidewall of the trench by the oxidation process. A third conductive layer is formed in the trench. Two body layers with a second conductivity type are formed in the epitaxial layer respectively beside the trench. Two doped regions with the first conductivity type are formed in the body layers respectively beside the trench.

In an embodiment of the invention, the method of forming the second insulating layer includes forming an insulating material layer on the epitaxial layer, wherein the insulating material layer fills up the trench, and performing an etching back process to remove a portion of the insulating material layer.

In an embodiment of the invention, the method of forming the second conductive layer includes using the second insulating layer as a mask to performing an anisotropic dry etching process.

In an embodiment of the invention, the method of forming the third insulating layer includes using the second conductive layer as the mask to perform the anisotropic dry etching process.

In an embodiment of the invention, the method of forming the third conductive layer includes forming a conductive material layer on the epitaxial layer, wherein the conductive material layer fills up the trench, and performing the etching back process to remove a portion of the conductive material layer.

In an embodiment of the invention, after the step of performing the oxidation process and before the step of forming the third conductive layer, the above-mentioned method further includes removing the fifth insulating layer and a portion of the fourth insulating layer, and forming a sixth insulating layer on the surfaces of the epitaxial layer and the trench.

In an embodiment of the invention, after the step of forming the doped region, the above-mentioned method further includes forming a dielectric layer on the third conductive layer and the doped regions, forming two openings penetrating the dielectric layer and the doped regions, and forming a fourth conductive layer on the dielectric layer, wherein the fourth conductive layer fills in the opening to be electrically connected to the body layers.

In an embodiment of the invention, a material of the fourth conductive layer includes metal.

In an embodiment of the invention, a material of the first conductive layer includes undoped polysilicon.

In an embodiment of the invention, a material of the third conductive layer includes doped polysilicon.

In an embodiment of the invention, the first conductivity type is N-type and the second conductivity type is P-type, or the first conductivity type is P-type and the second conductivity type is N-type.

The invention also provides another method of forming a trench gate MOSFET. An epitaxial layer with a first conductivity type is formed on a substrate with the first conductivity type. A trench is formed in the epitaxial layer. A first insulating layer is conformally formed on surfaces of the epitaxial layer and the trench. A first conductive layer is formed at the bottom of the trench. A portion of the first insulating layer is removed to form a second insulating layer exposing an upper portion of the first conductive layer. An oxidation process is performed to oxidize the first conductive layer to a third insulating layer, wherein a fourth insulating layer is the simultaneously formed on the surface of the epitaxial layer and on a sidewall of the trench by the oxidation process. A second conductive layer is formed in the trench. Two body layers with a second conductivity type are formed in the epitaxial layer respectively beside the trench. Two doped regions with the first conductivity type are formed in the body layers respectively beside the trench.

In an embodiment of the invention, the method of forming the first conductive layer includes forming a conductive material layer on the epitaxial layer, wherein the conductive material layer fills up the trench, and performing an etching back process to remove a portion of the conductive material layer.

In an embodiment of the invention, the method of forming the second insulating layer includes performing the etching back process till 2/3 to 4/5 height of the first conductive layer is exposed.

In an embodiment of the invention, the method of forming the second conductive layer includes forming a conductive material layer on the epitaxial layer, wherein the conductive material layer fills up trench, and performing the etching back process to remove a portion of the conductive material layer.

In an embodiment of the invention, after the step of performing the oxidation process and before the step of forming the second conductive layer, the above-mentioned method further includes removing the fourth insulating layer, a portion of the third insulating layer and a portion of the second insulating layer, and forming a fifth insulating layer on the surfaces of the epitaxial layer and the trench.

In an embodiment of the invention, after the step of forming the doped regions, the above-mentioned method further includes forming a dielectric layer on the second conductive layer and the doped regions, forming two openings penetrating the dielectric layer and the doped regions, and forming a third conductive layer on the dielectric layer, wherein the third conductive layer fills in the openings to be electrically connected to the body layers.

In an embodiment of the invention, a material of the third conductive layer includes metal.

In an embodiment of the invention, a material of the first conductive layer includes undoped polysilicon.

In an embodiment of the invention, a material of the second conductive layer includes doped polysilicon.

In an embodiment of the invention, the first conductivity type is N-type and the second conductivity type is P-type, or the first conductivity type is P-type and the second conductivity type is N-type.

According to the foregoing, in the invention, a polysilicon layer is firstly retained at the bottom of the trench, then an oxidation process is performed to transform the polysilicon layer to a silicon oxide layer, so that a trench MOSFET having a thick bottom oxide (TBOX) can be formed with a favorable process control. The steps disclosed by the invention are simple, and the thickness of the thick bottom oxide can be precisely controlled, and thus the method is considered to be relatively competitive.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

First Embodiment

FIG. 1A to FIG. 1H are cross sectional diagrams illustrating a method of forming a trench gate MOSFET according to the first embodiment of the present invention.

Figure 1A:
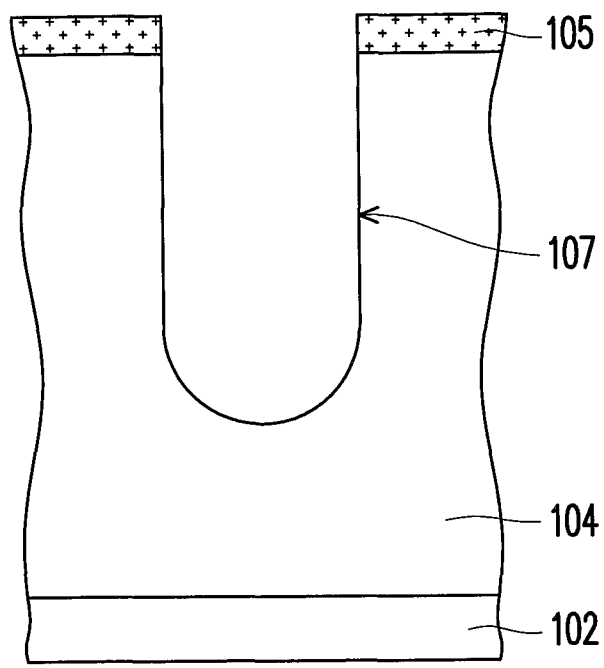
FIG. 1A to FIG. 1H are cross sectional diagrams illustrating a method of forming a trench gate MOSFET according to a first embodiment of the present invention.

Firstly, referring to FIG. 1A, an epitaxial layer 104 with a first conductivity type and a mask layer 105 are sequentially formed on a substrate 102 with the first conductivity type. The substrate 102 is, for example, an N-type heavily doped silicon substrate. The epitaxial layer 104 is, for example, an N-type lightly doped epitaxial layer, and the forming method thereof includes performing a selective epitaxy growth (SEG) process. A material of the mask layer 105 is, for example, silicon nitride, and the forming method thereof includes performing a chemical vapor deposition (CVD) process. Next, an etching process is performed by using the mask layer 105 as a mask to form a trench 107 in the epitaxial layer 104. Afterward, the mask layer 105 is removed.

Figure 1B:
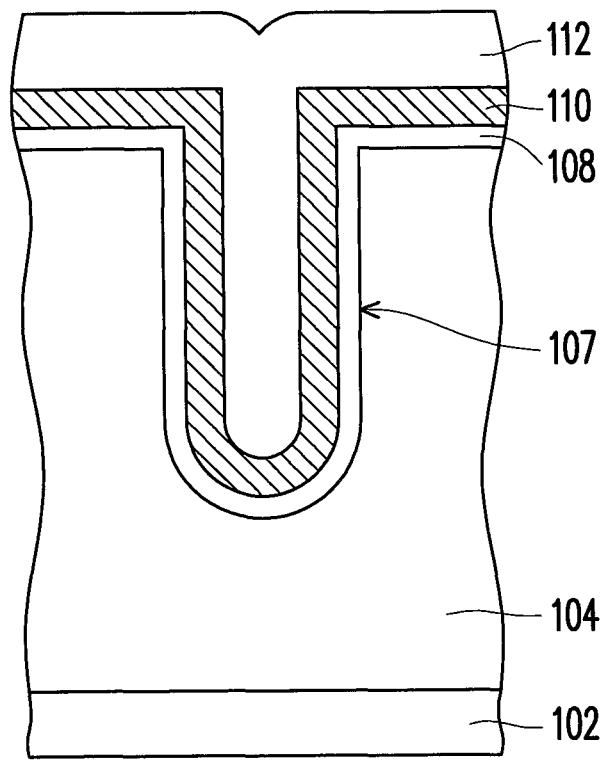

Then, referring to FIG. 1B, an insulating layer 108 and a conductive layer 110 are conformally formed on surfaces of the epitaxial layer 104 and the trench 107. A material of the insulating layer 108 is, for example, silicon oxide, and the forming method thereof includes performing a thermal oxidation process or a chemical vapor deposition process. A material of the conductive layer 110 is, for example, undoped polysilicon, and the forming method thereof includes performing a chemical vapor deposition process. Subsequently, an insulating material layer 112 is formed on the conductive layer 110, and the insulating material layer 112 fills up the trench 107. A material of the insulating material layer 112 is, for example, tetraethosiloxane (TEOS) silicon oxide, and the forming method thereof includes performing a chemical vapor deposition process.

Figure 1C:
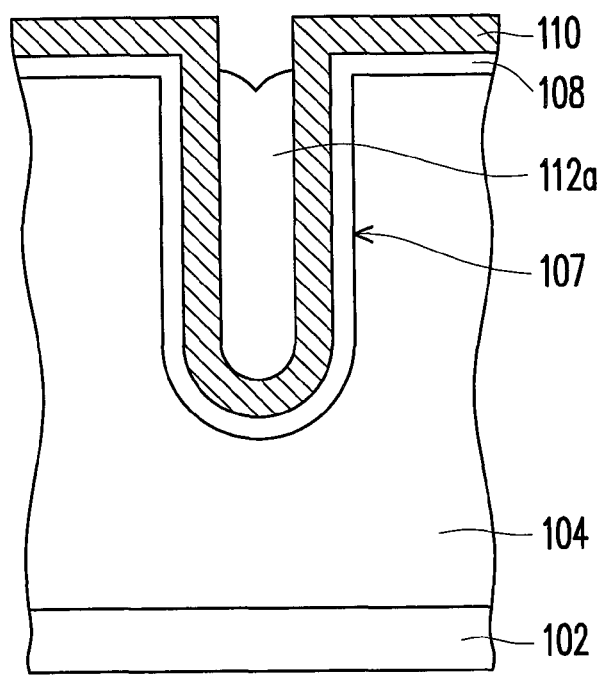

Afterward, referring to FIG. 1C, an etching back process is performed to remove a portion of the insulating material layer 112, so as to form an insulating layer 112a filling up the trench 107. In an embodiment, the top surface of the conductive layer 110 is exposed by the etching back process, and the thickness of the insulating layer 112a may be controlled with a time mode.

Figure 1D:
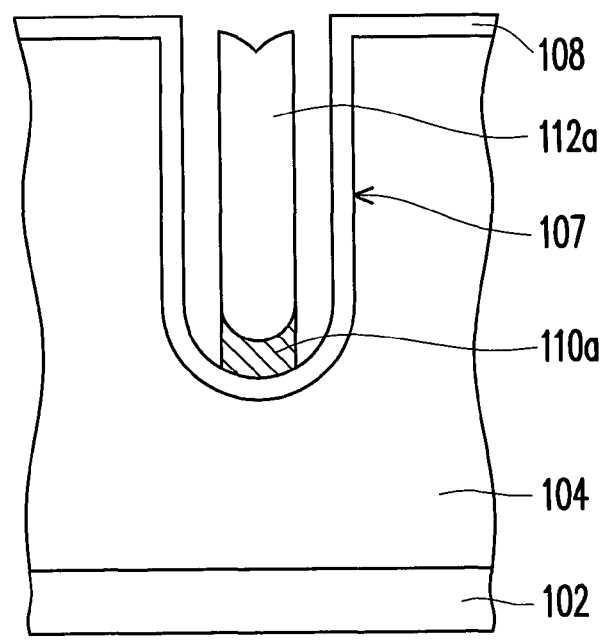

Next, referring to FIG. 1D, a portion of the conductive layer 110 is removed to form a conductive layer 110a below the insulating layer 112a. The method of forming the conductive layer 110a includes using the insulating layer 112a as a mask to perform an anisotropic dry etching process. In addition, since the above-mentioned method is to use the insulating layer 112a as a mask, it is a self-aligned process, wherein the conductive layer 110a is located right below the insulating layer 112a, and the boundary of the conductive layer 110a is aligned with the boundary of the insulating layer 112a.

Figure 1E:
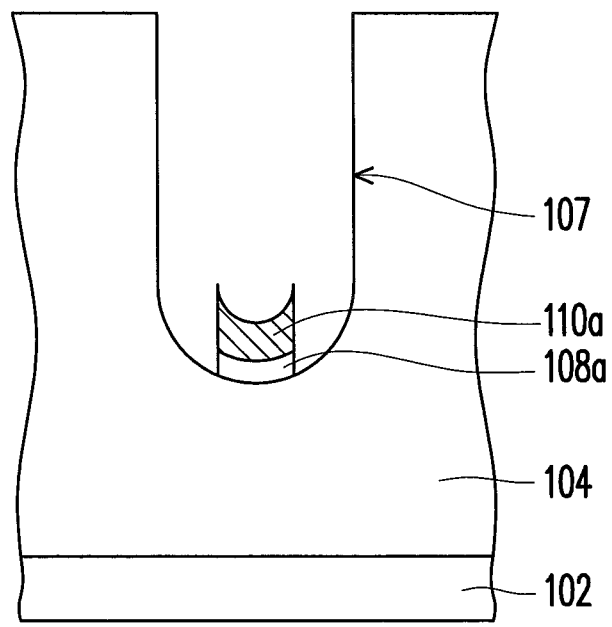

Then, referring to FIG. 1E, the insulating layer 112a and a portion of the insulating layer 108 are removed to form an insulating layer 108a below the conductive layer 110a. The method of forming the insulating layer 108a includes using the conductive layer 110a as a mask to perform an anisotropic dry etching process. In addition, since the above-mentioned method is to use the conductive layer 110a as a mask, it is a self-aligned process, wherein the insulating layer 108a is located right below the conductive layer 110a, and the boundary of the insulating layer 108a is aligned with the boundary of the conductive layer 110a.

Figure 1F:
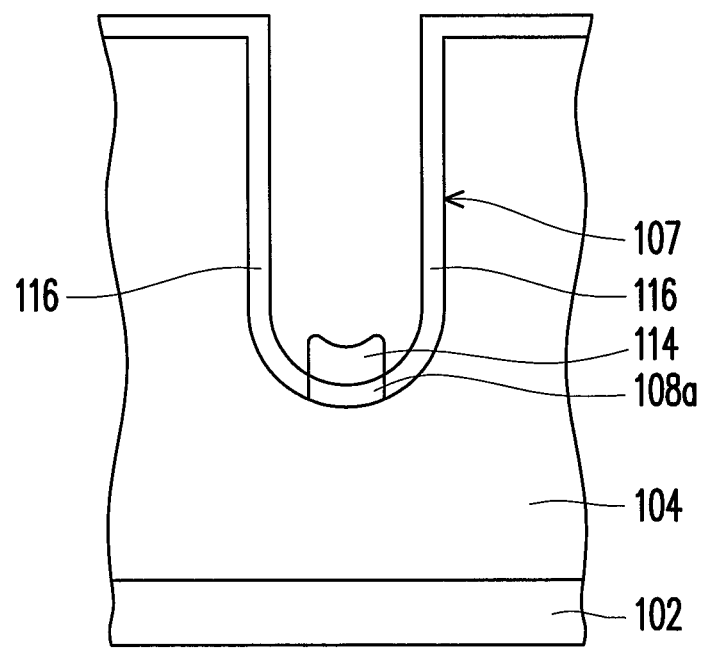

Afterward, referring to FIG. 1F, an oxidation process is performed to oxidize the conductive layer 110a to an insulating layer 114, wherein an insulating layer 116 is simultaneously formed on the surface of the epitaxial layer 104 and on a sidewall of the trench 107 by the oxidation process. A material of the insulating layer 114 and the insulating layer 116 is, for example, silicon oxide. In an embodiment, the entire conductive layer 110a is oxidized by the oxidation process, as shown in FIG. 1F. In another embodiment (not shown), only a portion of the conductive layer 110a is oxidized by the oxidation process.

It is noted that even if the thickness of the insulating layer 116 formed by the oxidation process does not meet the process requirement (e.g., too thick or too thin), the following steps may still be selectively performed. Firstly, an etching process is performed to remove the insulating layer 116 and a portion of the insulating layer 114. Then, a thermal oxidation process or a chemical vapor deposition process is performed to form an insulating layer with the required thickness (not shown) on the surfaces of the epitaxial layer 104 and the trench 107.

Figure 1G:
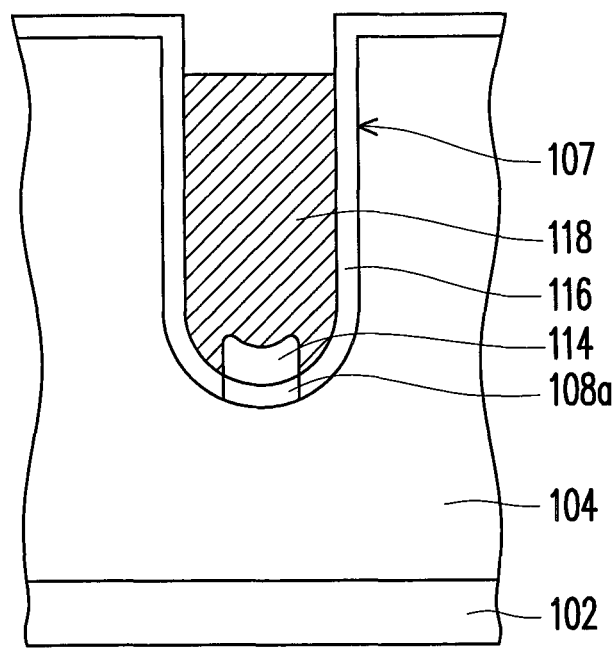

Subsequently, referring to FIG. 1G, a conductive layer 118 is formed in the trench 107. The method of forming the conductive layer 118 includes forming a conductive material layer (not shown) on the epitaxial layer 104, wherein the conductive material layer fills up the trench 107. A material of the conductive material layer is, for example, doped polysilicon, and the forming method thereof includes performing a chemical vapor deposition process. Then, an etching back process is performed to remove a portion of the conductive material layer.

Figure 1H:
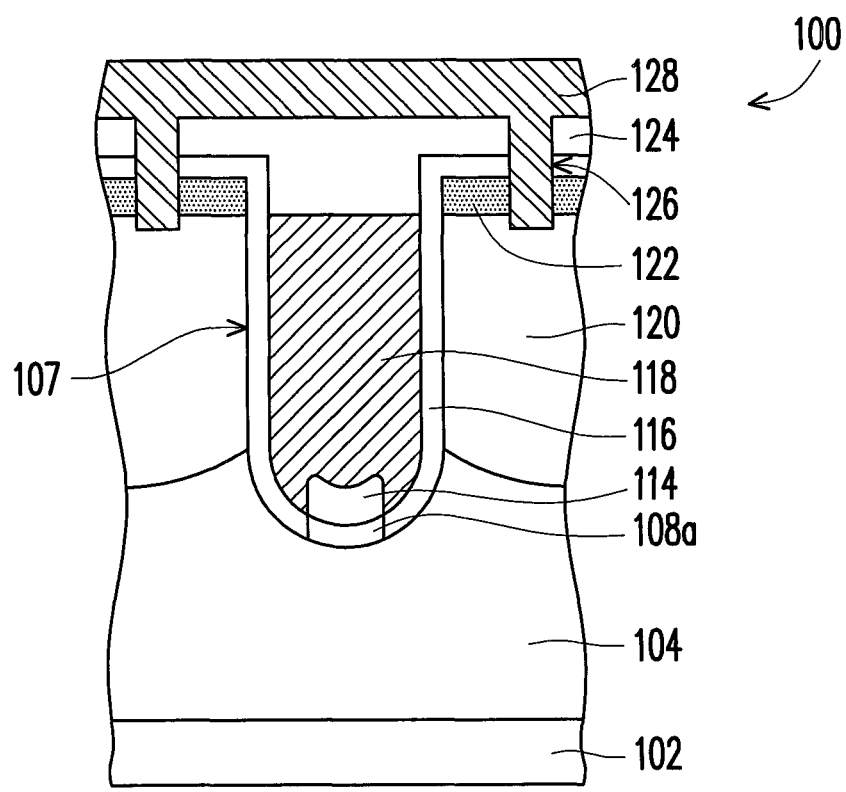

Next, referring to FIG. 1H, two body layers 120 with a second conductivity type are formed in the epitaxial layer 104 respectively beside the trench 107. The body layers 120 are, for example, P-type body layers, and the forming method thereof includes performing an ion implantation process. Then, two doped regions 122 with the first conductivity type are formed in the body layers 120 respectively beside the trench 107. The doped regions 122 are, for example, N-type heavily doped regions, and the forming method thereof includes performing an ion implantation process.

Subsequently, a dielectric layer 124 is formed on the conductive layer 118 and the doped regions 122. A material of the dielectric layer 124 is, for example, silicon oxide, borophosphosilicate glass (BPSG), phosphosilicate (PSG), fluorine silicate glass (FSG), or undoped silicate glass (USG), and the forming method thereof includes performing a chemical vapor deposition process. Next, two openings 126 penetrating the dielectric layer 124 and the doped regions 122 are formed. The method of forming the openings 126 includes performing lithographic and etching processes. Afterward, a conductive layer 128 is formed on the dielectric layer 124, wherein the conductive layer 128 fills in the openings 126 to be electrically connected to the body layers 120. A material of the conductive layer 128 may be metal such as aluminum, and the forming method thereof includes performing a chemical vapor deposition process. At this point, the manufacturing of the trench gate MOSFET 100 according to the first embodiment is completed, wherein the substrate 102 is used as a drain electrode, the doped regions 122 are used as source electrodes, the conductive layer 118 is used as a gate electrode, and the insulating layer 116 is used as a gate oxide layer. Moreover, a thick oxide layer, at the bottom of the trench 107, constituted of the insulating layer 108a and the insulating layer 114 may effectively lower the gate-to-drain capacitance $C_{gd}$ and enhance the device performance.

Second Embodiment

FIG. 2A to FIG. 2F are cross sectional diagrams illustrating a method of forming a trench gate MOSFET according to the second embodiment of the present invention.

Figure 2A:
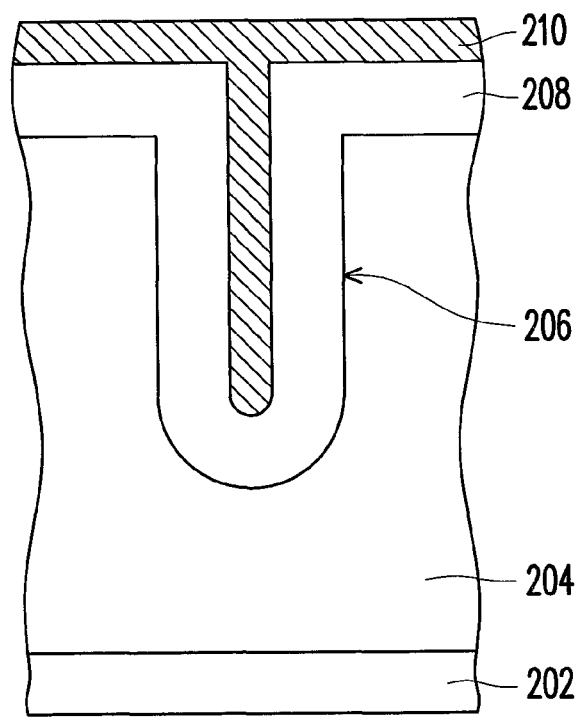
FIG. 2A to FIG. 2F are cross sectional diagrams illustrating a method of forming a trench gate MOSFET according to a second embodiment of the present invention.

Firstly, referring to FIG. 2A, an epitaxial layer 204 with a first conductivity type is formed on a substrate 202 with the first conductivity type. The substrate 202 is, for example, an N-type silicon substrate. The epitaxial layer 204 is, for example, an N-type epitaxial layer. Then, a trench 206 is formed in the epitaxial layer 204. The method of forming the epitaxial layer 204 and the trench 206 may be referred to the first embodiment, and thus is not repeated herein.

Next, an insulating layer 208 is conformally formed on surfaces of the epitaxial layer 204 and the trench 206. A material of the insulating layer 208 is, for example, silicon oxide, and the forming method thereof includes performing a thermal oxidation process or a chemical vapor deposition process. Then, a conductive material layer 210 is formed on the insulating layer 208, wherein the conductive material layer 210 fills up the trench 206. A material of the conductive material layer 210 is, for example, undoped polysilicon, and the forming method thereof includes performing the chemical vapor deposition process.

Figure 2B:
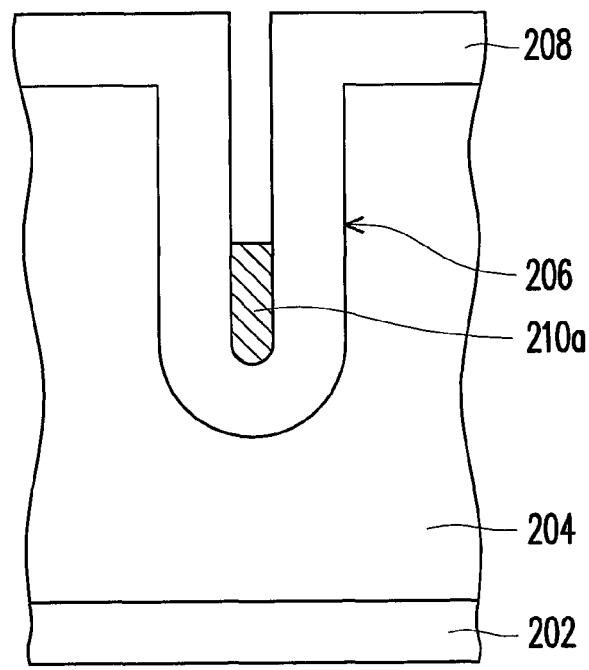

Afterward, referring to FIG. 2B, an etching back process is performed to remove a portion of the conductive material layer 210, so that a conductive layer 210a is formed at the bottom of the trench 206. In an embodiment, the top surface and a portion of the sidewall of the insulating layer 208 are exposed by the etching back process, and the thickness of the conductive layer 210a may be controlled with a time mode.

Figure 2C:
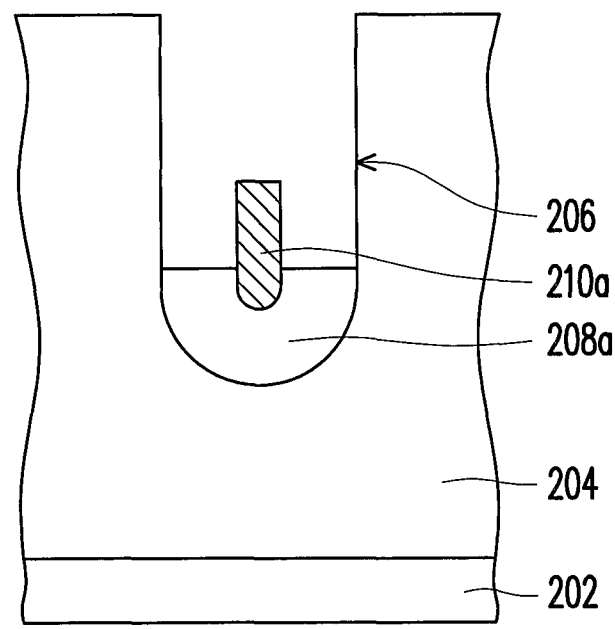

Subsequently, referring to FIG. 2C, a portion of the insulating layer 208 is removed to form an insulating layer 208a exposing an upper portion of the conductive layer 210a. The method of forming the insulating layer 208a includes performing an etching back process till ⅔ to ⅘ height of the conductive layer 210a is exposed. In an embodiment, the height exposed by the conductive layer 210a may be controlled with the time mode.

Figure 2D:
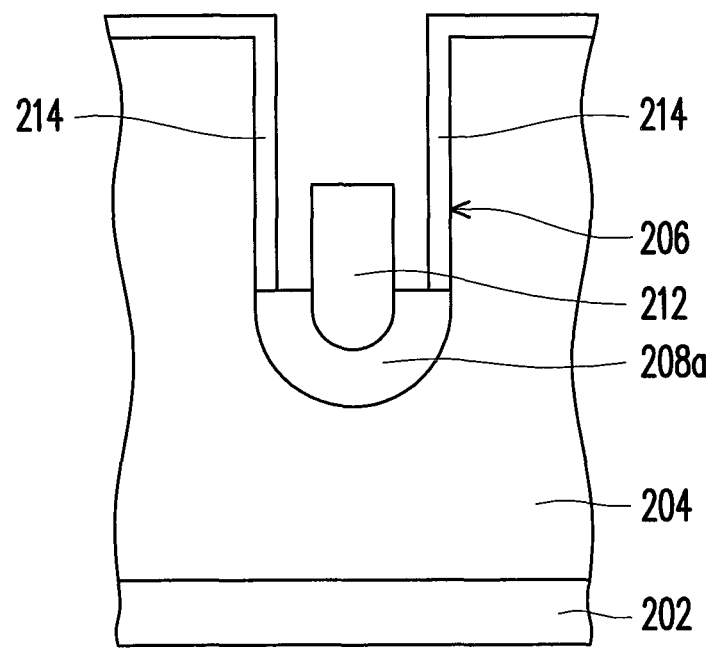

Next, referring to FIG. 2D, an oxidation process is performed to oxidize the conductive layer 210a to an insulating layer 212, and an insulating layer 214 is simultaneously formed on the surface of the epitaxial layer 204 and on a sidewall of the trench 206 by the oxidation process. A material of the insulating layer 212 and the insulating layer 214 is, for example, silicon oxide. In an embodiment, the entire conductive layer 210a is oxidized by the oxidation process, as shown in FIG. 2D. In another embodiment (not shown), only a portion of the conductive layer 210a is oxidized by the oxidation process.

It is noted that even if the thickness of the insulating layer 214 formed by the oxidation process does not meet the process requirement, the following steps may still be selectively performed. Firstly, an etching process is performed to remove the insulating layer 214, a portion of the insulating layer 212 and a portion of the insulating layer 208a. Then, a thermal oxidation process or a chemical vapor deposition process is performed to form an insulating layer with the required thickness (not shown) on the surfaces of the epitaxial layer 204 and the trench 206.

Figure 2E:
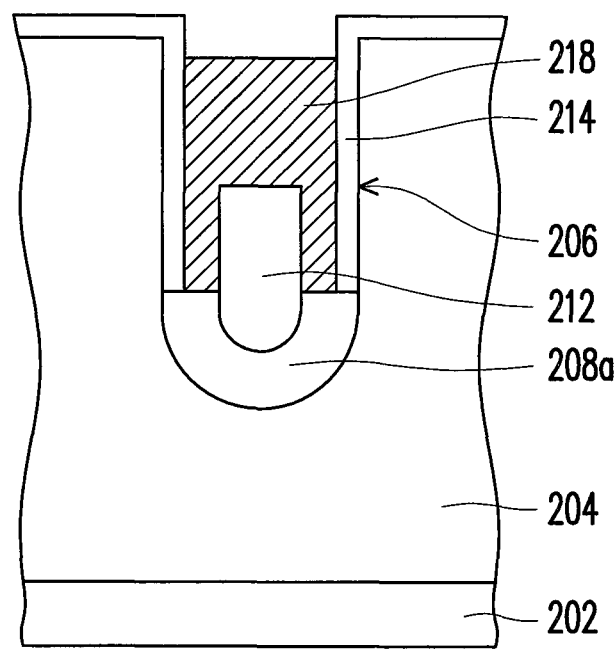

Then, referring to FIG. 2E, a conductive layer 218 is formed in the trench 206. The method of forming the conductive layer 218 includes forming a conductive material layer (not shown) on the epitaxial layer 204, wherein the conductive material layer fills up the trench 206. A material of the conductive material layer is, for example, doped polysilicon, and the forming method thereof includes performing a chemical vapor deposition process. Then, an etching back process is performed to remove a portion of the conductive material layer.

Figure 2F:
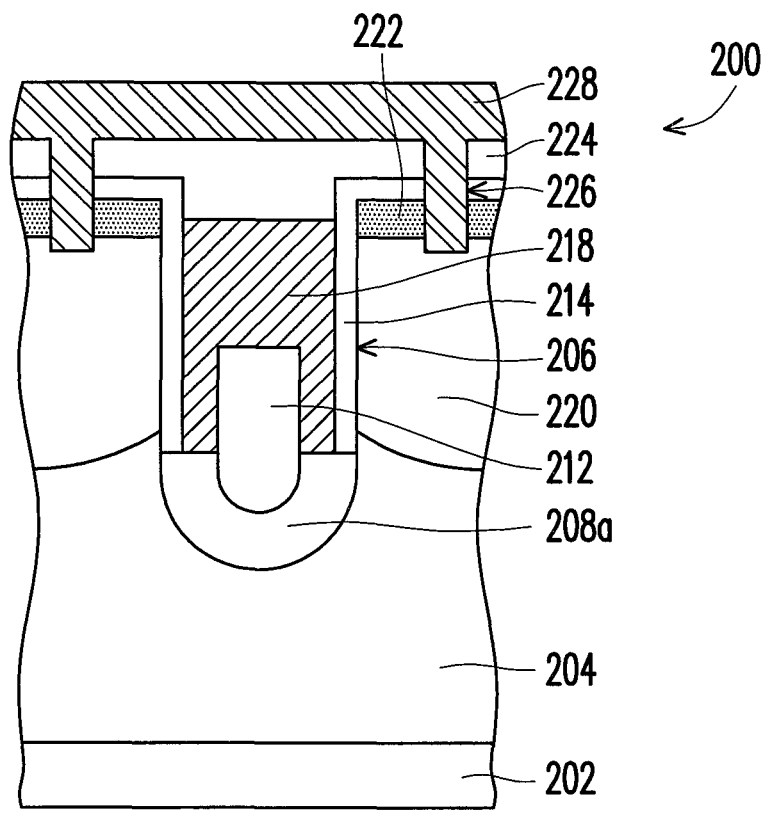

Next, referring to FIG. 2F, two body layers 220 with a second conductivity type are formed in the epitaxial layer 204 respectively beside the trench 206. The body layers 220 are, for example, P-type body layers. Afterward, two doped regions 222 with the first conductivity type are formed in the body layers 220 respectively beside the trench 206. The doped regions 222 are, for example, N-type heavily doped regions. Afterward, a dielectric layer 224 is formed on the conductive layer 218 and the doped regions 222. Subsequently, two openings 226 penetrating the dielectric layer 224 and the doped regions 222 are formed. Next, a conductive layer 228 is formed on the dielectric layer 224, wherein the conductive layer 228 fills in the openings 226 to be electrically connected to the body layers 220. Materials and the forming methods of the body layers 220, the doped regions 222 and the conductive layer 228 may be referred to the first embodiment, and thus are not repeated herein. At this point, the manufacturing of the trench gate MOSFET 200 according to the second embodiment is completed, wherein the substrate 202 is used as a drain electrode, the doped regions 222 are used as source electrodes, the conductive layer 218 is used as a gate electrode, and the insulating layer 214 is used as a gate oxide layer. Moreover, a thick oxide layer, at the bottom of the trench 206, constituted of the insulating layer 208a and the insulating layer 212 may effectively lower the gate-to-drain capacitance $C_{gd}$ and enhance the device performance.

In the above embodiments, the first conductivity type is considered as N-type and the second conductivity type is considered as P-type for the purpose of the description, but the invention is not limited thereto. One of the ordinary skill in the art would understand that the first conductivity type may also be considered as P-type and the second conductivity type may also be considered as N-type.

In summary, in the method of the invention, a polysilicon layer is firstly retained at the bottom of the trench, and then an oxidation process is performed to transform the polysilicon layer to a silicon oxide layer, so that a trench MOSFET having a thick bottom oxide (TBOX) can be formed with a favorable process control. The thickness of the thick bottom oxide may be precisely controlled by the thickness of the bottom insulating layer (e.g., the insulating layer 108a of the first embodiment or the insulating layer 208a of the second embodiment) and the thickness of the subsequent polysilicon layer (e.g. the conductive layer 110a of the first embodiment or the conductive layer 210a of the second embodiment), and thus the method is simple, the process window is wide, and the conventional problem of channel offset can be avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of forming a trench gate MOSFET, comprising:
    forming an epitaxial layer with a first conductivity type on a substrate with the first conductivity type;
    forming a trench in the epitaxial layer;
    conformally forming a first insulating layer and a first conductive layer on surfaces of the epitaxial layer and the trench;
    filling up the trench with a second insulating layer;
    removing a portion of the first conductive layer to form a second conductive layer below the second insulating layer;
    removing the second insulating layer and a portion of the first insulating layer to form a third insulating layer below the second conductive layer;
    performing an oxidation process to oxidize the second conductive layer to a fourth insulating layer, wherein a fifth insulating layer is simultaneously formed on the surface of the epitaxial layer and on a sidewall of the trench by the oxidation process;
    forming a third conductive layer in the trench;
    forming two body layers with a second conductivity type in the epitaxial layer respectively beside the trench; and
    forming two doped regions with the first conductivity type in the body layers respectively beside the trench.

2. The method of forming the trench gate MOSFET as recited in claim 1, wherein a method of forming the second insulating layer comprises:
    forming an insulating material layer on the epitaxial layer, and the insulating material layer filling up the trench; and
    performing an etching back process to remove a portion of the insulating material layer.

3. The method of forming the trench gate MOSFET as recited in claim 1, wherein a method of forming the second conductive layer comprises using the second insulating layer as a mask to perform an anisotropic dry etching process.

4. The method of forming the trench gate MOSFET as recited in claim 1, wherein a method of forming the third insulating layer comprises using the second conductive layer as a mask to perform an anisotropic dry etching process.

5. The method of forming the trench gate MOSFET as recited in claim 1, wherein the method of forming the third conductive layer comprises:
    forming a conductive material layer on the epitaxial layer, and the conductive material layer filling up the trench; and
    performing an etching back process to remove a portion of the conductive material layer.

6. The method of forming the trench gate MOSFET as recited in claim 1, further comprising, after the step of performing the oxidation process and before the step of forming the third conductive layer:
    removing the fifth insulating layer and a portion of the fourth insulating layer; and
    forming a sixth insulating layer on the surfaces of the epitaxial layer and the trench.

7. The method of forming the trench gate MOSFET as recited in claim 1, further comprising, after the step of forming the doped regions:
    forming a dielectric layer on the third conductive layer and the doped regions;
    forming two openings penetrating the dielectric layer and the doped regions; and
    forming a fourth conductive layer on the dielectric layer, wherein the fourth conductive layer fills in the openings to be electrically connected to the body layers.

8. The method of forming the trench gate MOSFET as recited in claim 7, wherein a material of the fourth conductive layer comprises metal.

9. The method of forming the trench gate MOSFET as recited in claim 1, wherein a material of the first conductive layer comprises undoped polysilicon.

10. The method of forming the trench gate MOSFET as recited in claim 1, wherein a material of the third conductive layer comprises doped polysilicon.

11. The method of forming the trench gate MOSFET as recited in claim 1, wherein the first conductivity type is N-type and the second conductivity type is P-type; or the first conductivity type is P-type and the second conductivity type is N-type.

* * * * *